United States Patent [19]

Callan

[11] 4,288,744

[45] Sep. 8, 1981

[54] SUMMING WATT-HOUR TRANSDUCER

[75] Inventor: John E. Callan, Milwaukee, Wis.

[73] Assignee: Allen-Bradley Company, Milwaukee, Wis.

[21] Appl. No.: 58,752

[22] Filed: Jul. 19, 1979

[51] Int. Cl.³ .................... G01R 21/06; G01R 19/16; H02J 3/14

[52] U.S. Cl. ................................. 324/142; 307/38; 324/103 R

[58] Field of Search ...................... 324/142, 103 R; 364/493; 307/38, 35

[56] References Cited

U.S. PATENT DOCUMENTS

| | | | |
|---|---|---|---|
| 3,470,471 | 9/1969 | Moore | 324/142 |
| 3,794,917 | 2/1974 | Martin et al. | 324/142 |
| 3,976,941 | 8/1976 | Milkovic | 324/142 |
| 4,075,699 | 2/1978 | Schneider et al. | 324/103 R |
| 4,079,313 | 3/1978 | Callan | 324/142 |
| 4,125,782 | 11/1978 | Pollnow, Jr. | 307/38 |

*Primary Examiner*—Ernest F. Karlsen
*Attorney, Agent, or Firm*—Quarles & Brady

[57] ABSTRACT

A summing watt-hour transducer is connected to a three-phase power line to monitor the energy being supplied to one load, and is connected to an ordinary watt-hour transducer that monitors energy supplied to a second load. A summing integrator circuit sums and integrates signals derived from the power line and the ordinary watt-hour transducer to obtain a voltage proportional to a unit of total energy demand. The summing operation is triggered by a signal from a control circuit that is responsive to contact closure pulses from the ordinary watt-hour transducer. Output signals from the summing integrator circuit are converted to contact closures for input of energy demand signals to an energy demand/schedule controller.

10 Claims, 3 Drawing Figures

SUMMING WATT-HOUR TRANSDUCER

BACKGROUND OF THE INVENTION

1. Field of the Invention

The field of the invention is energy monitoring devices such as watt meters and watt-hour meters, and more specifically, power transducers used instead of utility power meters to provide inputs to energy demand/schedule controllers. 2. Description of the Prior Art Watts transducers are disclosed in Martin et al, U.S. Pat. No. 3,794,917, issued Feb. 26, 1974, and Callan, U.S. Pat. No. 4,079,313, issued Mar. 14, 1978. Watts transducers generate a voltage proportional to the instantaneous power (watts) being consumed by a load. In U.S. Pat. No. 4,079,313, this voltage is converted to pulses which are counted to monitor total energy demand in watt-hours. In Milkovic, U.S. Pat. No. 3,976,941, issued Aug. 24, 1976, a circuit that generates a voltage proportional to single-phase instantaneous power (in watts) is included in an electronic watt-hour meter.

Energy demand/schedule controllers require an input signal proportional to the watt-hours supplied to the building or facility being served. This signal is sometimes available from the utility company's power metering equipment, which provides contact closures, or "pulses," where each pulse represents a unit of energy consumption, such as a watt-hour. When power meter contacts are not available, a watt-hour transducer, such as disclosed in U.S. Pat. No. 4,079,313, cited above, can be used to monitor energy consumption. Where the power factor and voltage in a power distribution system are relatively constant, an amp-hour transducer is sometimes used to generate pulses for an electrical demand controller.

The transducers described above are limited to monitoring a single polyphase supply line carrying power to a load within a building or facility.

SUMMARY OF THE INVENTION

The invention relates to a summing transducer that provides a pulse for each unit of energy supplied to a plurality of loads through separate feeder lines in a power distribution network.

The summing transducer of the present invention includes a power transducer of a known type that generates a signal proportional to the instantaneous power (watts) supplied to a first load. The invention is provided by the combination of other circuitry with the power transducer, including a control circuit coupled to a device that monitors the energy (watt-hours) supplied to a second load. This control circuit responds to a pulse from the monitoring device to trigger the summing operation.

The summing operation occurs as follows. A signal analogous to an instantaneous power signal for the second load is derived by coupling a capacitor to a voltage supply through a switch means to charge the capacitor, and then coupling the charged capacitor to an input of a summing integrator circuit in response to the control signal. The summing integrator circuit sums and integrates the current generated by the charged capacitor with the instantaneous power signal received from the power transducer to generate an output signal proportional to the total energy consumption of the two loads. This output signal is coupled to a unit measuring means for generating an output signal each time a preselected unit of energy is consumed by the two loads.

A summing watt-hour transducer can be connected to a three-phase distribution line supplying energy to the first load and to an ordinary watt-hour transducer that monitors energy supplied to the second load. The summing transducer sums instantaneous power signals derived from the first load with energy demand pulses from the ordinary watt-hour transducer monitoring the second load to provide pulses representing the total energy consumption of the two loads. These resulting pulses can then be supplied to an energy demand/schedule controller.

One object of the invention is to monitor the energy consumption of loads supplied by different polyphase distribution lines.

Another object of the invention is to provide a watt-hour transducer that can be connected to another watt-hour transducer to provide the total watt-hours or other energy units being measured by the two transducers.

Another object of the invention is to provide a solid-state summing circuit that is small in size and easily incorporated into a standard watt-hour transducer to provide the summing feature.

Another object of the invention is to provide a summing watt-hour transducer that generates pulses of the type recorded by energy demand/schedule controllers in monitoring a distribution network with branches feeding several loads.

The foregoing and other object and advantages of the invention will appear from the following description. In the description reference is made to the accompanying drawings which form a part hereof, and in which there is shown by way of illustration a preferred embodiment of the invention. Such embodiment does not necessarily represent the full scope of the invention, however, and reference is therefore made to the claims for interpreting the scope of the invention.

DETAILED DESCRIPTION OF THE PREFERRED EMBODIMENT

Figure 1:
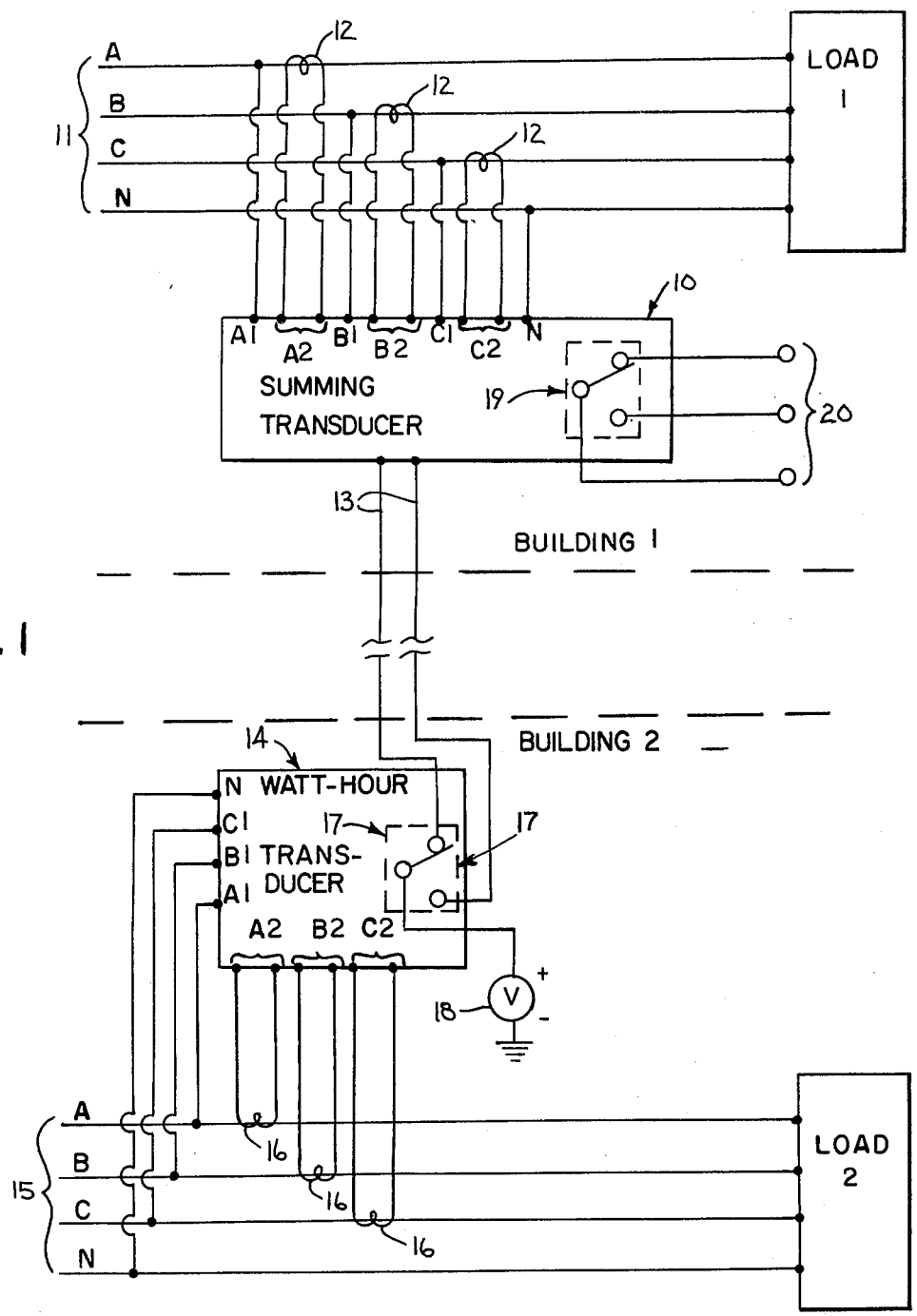
FIG. 1 is a schematic diagram showing the connection of a summimg watt-hour transducer of the present invention to monitor loads supplied by different branches of a power distribution network.

Referring to FIG. 1, a summing watt-hour transducer 10 that incorporates the present invention is connected to a three-phase supply line 11 having single phase lines A, B and C, and neutral line N connected to LOAD 1 in BUILDING 1. The summing watt-hour transducer 10 has inputs A1, B1 and C1 connected to lines A, B and C, respectively, of supply line 11 to monitor line voltages. The transducer 10 also has inputs A2, B2 and C2 connected to current transformers 12 in lines A, B and C, respectively, to monitor line currents. Finally, the transducer has an N input connected to the neutral line N in the four-wire, three-phase supply line 11.

The summing watt-hour transducer 10 also has a pair of inputs connected through two lines 13 to a conventional watt-hour transducer 14 that monitors the energy supplied to LOAD 2 in BUILDING 2. This watt-hour transducer 14 has inputs A1, B1 and C1 connected to lines, A, B and C, respectively, in a second three-phase supply line 15 supplying power to LOAD 2. The watt-hour transducer 14 also has inputs A2, B2 and C2 connected to current transformers 16 in lines A, B and C of the polyphase supply line 15. And finally, the watt-hour transducer 14 has an N input connected to the neutral line N in the four-wire, three-phase supply line 15.

The ordinary watt-hour transducer 14 includes a switch 17 with a pair of stationary contacts and with at least one movable contact connected to a voltage source 18. When the movable contact engages one of the stationary contacts, a signal is transmitted on one of the lines 13 connecting the ordinary watt-hour transducer 14 and the summing watt-hour transducer 10. As shall be explained in more detail below, the summing watt-hour transducer 10 also has a switch 19 that provides a contact closure for each energy unit that is collectively consumed by LOAD 1 and LOAD 2. Each contact closure generates a voltage pulse at the outputs 20 of the summing watt-hour transducer 10. These outputs 20 can be connected to an energy demand/schedule controller (not shown) that monitors and controls the energy supplied to the two loads.

Figure 2:
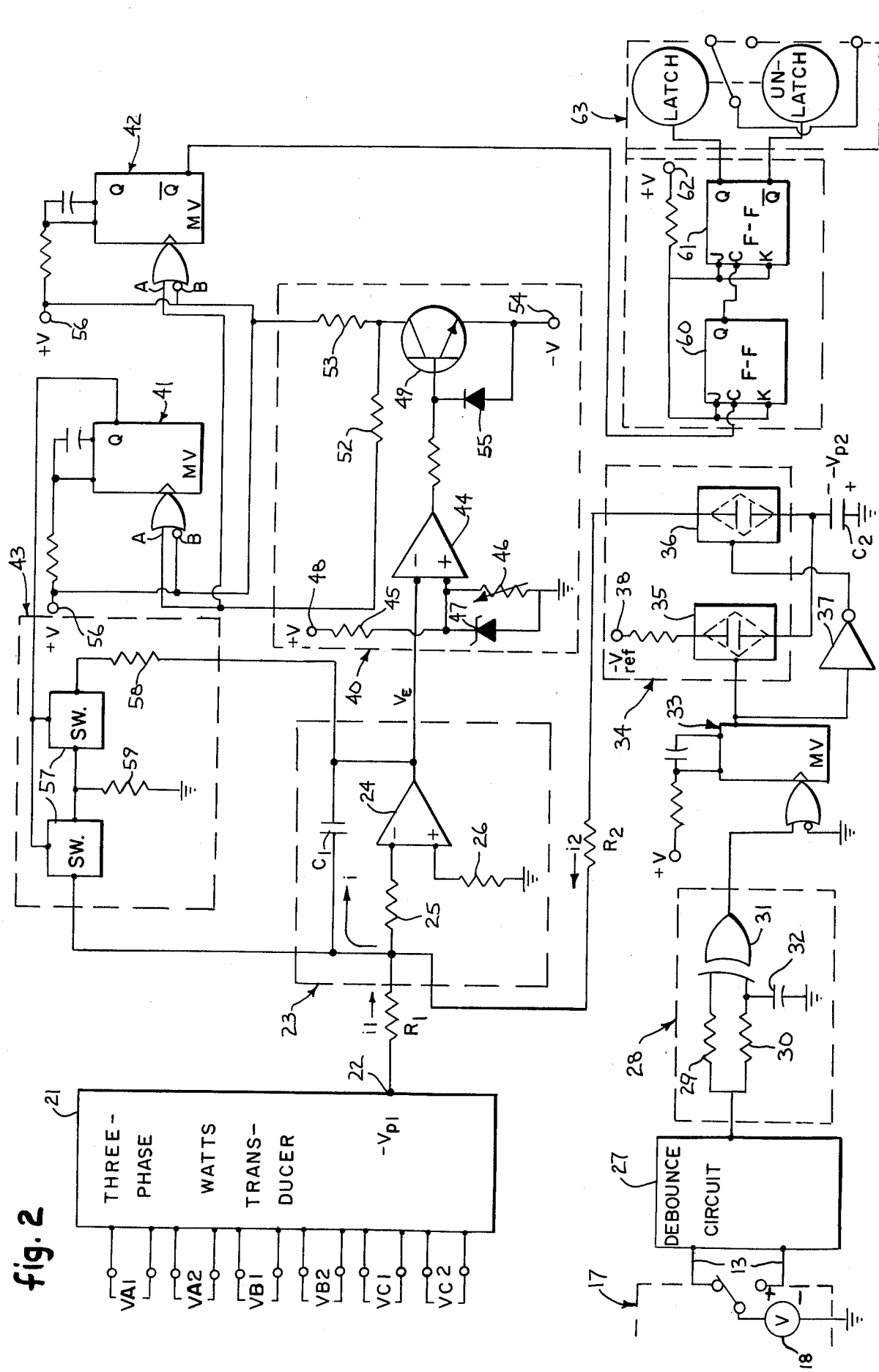
FIG. 2 is an electrical schematic diagram of the summing watt-hour transducer of the present invention.

Referring now to FIG. 2, the summing watt-hour transducer 10 includes a three-phase watts transducer 21, which can be one of several types known in the art. The monitoring inputs A1, A2, B1, B2, C1 and C2 for the summing watt-hour transducer 10 are also inputs to this three-phase watts transducer 21. The transducer 21 multiplies each of the line voltages VA1, VB1 and VC1 by a corresponding voltage VA2, VB2 and VC2 that is proportional to each respective line current. This multiplication provides the instantaneous power for each phase—which may or may not then be adjusted for the power factor—and the individual phases are summed to obtain a total instantaneous power for the three phases of supply line 11 in FIG. 1. The watts transducer 21 generates an output voltage $-V_{P1}$ that is proportional to the instantaneous power being supplied for the three phases. The output of the watts transducer 22 is connected through resistor $R_1$ to a summing input on a summing integrator circuit 23.

The summing integrator circuit 23 includes an operational amplifier 24 with an inverting input that is coupled through a resistor 25 to the summing input. A capacitor $C_1$ is connected between the summing input and the output of the operational amplifier 24, and the noninverting input of the operational amplifier 24 is connected through a biasing resistor 26 to signal ground. The summing integrator circuit 23 integrates instantaneous power signals, such as $-V_{P1}$ at output 22, to obtain the energy consumed by LOAD 1 for a period of time T.

To derive an instantaneous power signal for LOAD 2 in FIG. 1, the switch 17 in the ordinary watt-hour transducer 14 is connected through lines 13 to a contact debounce circuit 27 in FIG. 2. This circuit 27 is one of many such circuits known in the art and has a pair of NAND gates (not shown) each with a single output connected to one of two inputs on the other. This circuit 27 provides an unambiguous output signal because the signal produced by the bouncing of the movable contact against an unactuated stationary contact will be filtered out by a disabled NAND gate. The output of the contact debounce circuit 27 is connected to the input of a pulse circuit 28 and is further circuited through a pair of resistors 29 and 30 to the inputs of a two-input XOR gate 31. One of the inputs to the XOR gate 31 is coupled through a capacitor 32 to signal ground. While the capacitor 32 is charging, a pulse is generated at the output of the XOR gate 31. When the capacitor 32 is fully charged, the output of the XOR gate 31 is switched to provide the trailing edge of the pulse.

The circuitry just described is provided so that each contact closure in the switch 17 generates a pulse at the input of a one-shot multivibrator 33. The multivibrator 33 generates an output signal that controls the switching of a solid state relay 34. The solid state relay 34 has a set of normally closed (NC) switch contacts 35 and a set of normally open (NO) switch contacts 36. The output of the one-shot multivibrator 33 is connected to actuate (open) the NC switch contacts 35 and is connected through an inverter 37 to actuate (close) the NO switch contacts 36 at the same time. A negative voltage source 38 is coupled through a resistance 39, the NC switch contacts 35 and a capacitor $C_2$ to signal ground, so that the capacitor $C_2$ will be charged to a negative reference voltage, $-V_{REF}$. The capacitor $C_2$ is decoupled from the negative voltage source 38 when the NO switch contacts 36 are actuated (closed) by an output pulse from the one-shot multivibrator 33, and is coupled through resistor $R_2$ to the summing input of the integrator circuit 23 when the NC switch contacts 36 are actuated (opened) by the same output pulse.

When the relay 34 is switched, the negative voltage on the capacitor $C_2$, which shall be called $-V_{P2}$, generates a current $i_2$ through the resistor $R_2$. Thus, two negative input voltages $-V_{P1}$ and $-V_{P2}$ are presented at the inputs of the summing integrator circuit 23, and these voltages are summed and integrated to provide an output voltage $V_E$ proportional to the energy consumed by LOAD 1 and LOAD 2.

The negative voltage $-V_{P1}$ that is generated by the three-phase watts transducer 21 is proportional to the instantaneous power being supplied to LOAD 1 in FIG. 1.

This signal can be integrated to determine energy consumption according to the classic definition:

$$E = \int_O^T e(t)i(t)dt \qquad (1)$$

where:
E = energy
e(t) = instantaneous value of sensed voltage,
i(t) = instantaneous value of sensed current,
T = time interval during which power is measured,
and $[e(t)] \times [i(t)] \propto -V_{P1}$ By integrating $-V_{P1}$, a voltage is obtained that is proportional to a unit of energy, such as a fraction of a watt-hour, which is being consumed by LOAD 1 in the time interval T. This is accomplished with the summing integrator circuit 23, where a component $V_{E1}$ of the total integrator output voltage $V_E$ is due to $-V_{P1}$ and the current $i_1$ produced in resistor $R_1$. This is expressed as:

$$V_{E1} = -\frac{1}{C_1} \int_O^T i_1 \, dt \qquad (2)$$

but since $i_1 = V_{P1}/R_1$ the expression can be rewritten as follows:

$$V_{E1} = R_1 \frac{1}{C_1} \int_O^T V_{p1} \, dt \tag{3}$$

A second component, $V_{E2}$, of the total integrator output voltage, $V_E$, is provided when the capacitor $C_2$ is charged to the negative voltage, $-V_{P2}$, due to the closure of the contacts in the ordinary watt-hour transducer 14. The reference voltage, $-V_{REF}$, which is equal to $-V_{P2}$, is selected to be proportional to a unit of energy consumed by LOAD 2 in FIG. 1. The component $V_{E2}$ of the integrator output voltage $V_E$ results from the current $i_2$ that flows through resistor $R_2$ when the NO switch contacts 36 are actuated. This component can be expressed as:

$$V_{E2} = -\frac{1}{C_1} \int_O^T i_2 \, dt \tag{4}$$

The current $i_2$ from the charged capacitor can also be expressed in terms of the charge on capacitor $C_2$, namely:

$$i_2 = -(dQ_{C2}/dt) \tag{5}$$

Substituting, we get:

$$V_{E2} = \frac{1}{C1} \int_O^T \frac{dQ_{C2}}{dt} \, dt \tag{6}$$

$$V_{E2} = (Q_{C2}/C1) \tag{7}$$

It can be seen that the energy consumed by LOAD 2 can be represented by a charge on capacitor $C_2$, which is detected by the integrator circuit 23, when integrating the current $i_2$ as the capacitor $C_2$ discharges.

Furthermore, since the charge on capacitor $C_2$ is a function of the capacitance of $C_2$ and the voltage $-V_{P2}$ applied to it, the equation (7) can be rewritten as follows:

$$V_{E2} = (C2/C1)V_{P2} \tag{8}$$

The total energy consumed by LOAD 1 and LOAD 2 is obtained at the output the summing integrator circuit 23 in terms of $-V_{P1}$ and $-V_{P2}$ by combining equations (3) and (8) above.

$$V_E = \frac{1}{C1} \int_O^T V_{p1} \, dt + \left(\frac{C2}{C1}\right) V_{p2} \tag{9}$$

The output of the summing integrator circuit 23 is connected to an input of a voltage level detector circuit 40. The output of this voltage level detector circuit 40 is connected to inputs on both a reset one-shot multivibrator 41 and an output one-shot multivibrator 42. An output on the reset one-shot multivibrator 41 is connected back to the summing integrator circuit 23 through a reset circuit 43. The time period T in the equations given above is determined by the level at which the voltage level detector circuit 40 triggers the reset circuit 43.

The voltage level detector circuit 40 includes an operational amplifier 44 used as a comparator. A biasing network of a simple resistor 45, a variable resistor 46 and a zener diode 47 is connected to the noninverting input on the amplifier 44. The zener diode 47 is connected in parallel to the variable resistor 46 between the noninverting input of the comparator 44 and signal ground to maintain a constant voltage at the noninverting input. The resistor 45 is connected between a positive voltage source 48 and the noninverting input. The inverting input of the operational amplifier 44 also serves as the input of the voltage level detector circuit 40 and is therefore connected to the output of the operational amplifier 24. When the voltage at the inverting input becomes greater than the voltage at the noninverting input due to an output signal $V_E$ from the integrating operational amplifier 24, the comparator 42 generates a negative output voltage.

The output of the comparator 44 is connected through a resistor 50 to the base of the NPN transistor 49 to control the switching of the transistor 49. The collector of the NPN transistor 49 is connected through another resistor 51 to an "A" input on both the reset and output multivibrators 41 and 42. The collector of the NPN transistor 49 is also connected through another resistor 53 to a "B" input on both multivibrators 41 and 42. The emitter of the NPN transistor is connected to a voltage source 54 providing a slightly negative supply voltage. A diode 55 has its cathode connected to the base of the transistor 49 and its anode connected to the emitter of the transistor 49 to protect the base emitter junction from large negative voltages. Normally, the NPN transistor 49 is conducting, which pulls the "A" gate inputs of the multivibrators 41 and 42 low, while the "B" inputs on the multivibrators 41 and 42 are held high by a positive voltage source 56. When the output of the comparator 44 goes negative, the NPN transistor 49 is shut off, and a logic high signal is generated at the "A" inputs of the multivibrators 41 and 42 to generate logic high pulses at the Q outputs. One of these pulses is fed back to the reset circuit 43.

The reset circuit 43 includes a pair of electronic switches 57 which are part of a quad bilateral switch circuit, CD4066B, manufactured by RCA. The switches 57 each have a control input that is connected to the Q output of the reset multivibrator 41. The switches 57 are connected across the capacitor $C_1$ with a resistor 58, so that when the switches 57 are closed, the resistor 58 will provide an alternate path for current that would otherwise charge capacitor $C_1$. A discharge path for current from capacitor $C_1$ is provided by a resistor 59 connected from a junction between the switches 57 to signal ground. When the switches 57 are actuated by a pulse from the reset multivibrator 41, the integrating operational amplifier 24 ceases to integrate and becomes simply a summing amplifier. The ratio of resistances of the resistor 58 and the resistor $R_1$ is such that a very small output signal is generated by the summing operational amplifier 24.

Figure 3:
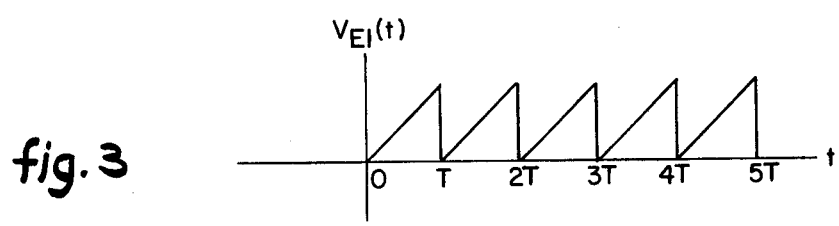
FIG. 3 is a graph of a component of the output voltage of a summing integrator circuit in FIG. 2, as a function of time.

Referring to FIG. 3, the output voltage component $V_{E1}$ of the summing integrator 23 is shown as a function of time. It shall be assumed that the output voltage $-V_{P1}$ of the three-phase watts transducer 21 is constant to generate a constant current $i_1$. In this circumstance, the output voltage component $V_{E1}$ from the summing integrator circuit 23 will be a ramp function as seen in FIG. 3. The addition of a nonlinear voltage component $V_{E2}$, due to the discharge of the capacitor $C_2$ when the relay 34 is actuated by the control signal, introduces some amount of nonlinearity into the waveform shown in FIG. 3. The output voltage $V_E$ increases from time O until time T when the one-shot multivibrator 41 actuates the reset circuit 43. When $V_E$ drops to nearly zero, the voltage generated at the output of the voltage level detection circuit 40 becomes more positive and allows the NPN transistor 49 to conduct once again and allows the above-described sequence to be repeated between time T and time 2T.

At the same time the reset one-shot multivibrator 41 is generating a reset pulse, the output one-shot multivibrator 42 is generating an output pulse. The output of the output multivibrator 42 is connected to a clock input on one of two J-K flip-flops 60 and 61. The Q output of the first J-K flip-flop 60 is connected to the clock input on the second J-K flip-flop 61, and the J and K inputs on both flip-flops are pulled high by a positive voltage source 62. The second J-K flip-flop 61 has its Q and Q outputs connected to a latching coil and unlatching coil, respectively, of a dual coil latching relay 63. Together the flip-flops 61 and 62 form a divide-by-2 counter, so that the relay 63 is switched on every other pulse from the output multivibrator 42. This occurs because each latching or unlatching of the relay is taken as a contact closure for measuring a unit of energy consumption such as a watt-hour.

What has been described is a summing watt-hour transducer that directly monitors energy supplied to one load and sums it with pulses from a device monitoring power to a second load to monitor total energy demand. This is made possible in part by the summing integrator circuit 23 and the coupling circuitry used to couple pulses from another energy-monitoring device to the summing integrator circuit. As the principles of the invention may be applied to other embodiments, the following claims shall define the scope of the invention.

I claim:

1. A summing transducer for summing the energy consumption of a first load, which is connected to a plurality of power supply lines, and the energy consumption that is measured for a second load by an energy-monitoring device that generates an energy demand signal, the transducer comprising:

power transducer means, coupled to the power supply lines, for generating a signal proportional to the instantaneous power being supplied to the first load;

summing integrator means having two inputs and an output, one input being coupled to the power transducer means to receive the signal proportional to the instantaneous power supplied to the first load, and the other input being connected to receive a signal derived from the energy demand signal provided by the energy-monitoring device, the summing integrator means being responsive to the received signals for generating an output signal proportional to a unit of energy consumption for the two loads;

control means adapted to be coupled to the energy-monitoring device, and responsive to the energy demand signal from the energy-monitoring device to generate a control signal;

a capacitor;

switch means connected between a voltage supply and the capacitor and connected between the capacitor and the second input on the summing integrator means for initially coupling the capacitor to the voltage supply to charge the capacitor to a value proportional to a unit of energy demand for the second load, the switch means being coupled to the control means and being responsive to the control signal therefrom to electrically couple the charged capacitor to the second input of the summing integrator means; and unit measuring means coupled to the output of the summing integrator means and responsive to the output signal therefrom for generating a signal representing the consumption of a preselected unit of energy by the two loads, whereby the discharge of the capacitor in response to its coupling to the second input on the summing integrator means provides a signal that can be summed and integrated with the signal from the power transducer means to generate the signal proportional to a unit of energy consumption for the two loads.

2. The summing transducer of claim 1, wherein the control means includes:

triggering pulse means coupled to the energy-monitoring device and responsive to a contact closure in the energy-monitoring device to generate an output pulse; and one-shot pulse means coupled between the triggering pulse means and the switch means and responsive to the output pulse from the triggering pulse means to generate the control signal to the switch means.

3. The summing transducer of claim 1, wherein the unit measuring means includes:

voltage level detection means coupled to the output of the summing integrator means for generating an output signal when the output of the summing integrator means reaches a preselected value; and reset means, coupled back to the summing integrator means, and coupled to the voltage level detection means and responsive to an output signal therefrom, for generating a signal that terminates integration to define a unit of energy consumption.

4. The summing transducer of claim 3, wherein the unit measuring means further includes:

a dual-coil latching relay in which switch contacts are operated;

flip-flop means having a first output connected to a first coil on the latching relay and having a second output connected to a second coil on the latching relay; and one-shot pulse means coupling the output of the voltage level detection means to the flip-flop means and responsive to an output signal from the voltage level detection means to cause the energizing of one of the coils in the latching relay and the operation of the switch contacts therein.

5. The summing transducer of claim 3, wherein the reset means includes a one-shot multivibrator coupled between the output of the voltage level detection means and the summing integrator means.

6. A summing circuit, responsive to an instantaneous power signal derived for a first load and responsive to an energy demand signal derived for a second load, for generating a pulse for a preselected unit of energy collectively consumed by the two loads, the circuit comprising:

first means with an input at which the energy demand pulse is received for generating a control signal in response to the energy demand pulse;

a capacitor;

switch means, connected between a voltage supply and the capacitor, for coupling the capacitor to the voltage supply to charge the capacitor, the switch means being connected to the first means and being responsive to the control signal therefrom to couple the charged capacitor to a discharge path;

summing integrator means with a first input that receives the instantaneous power signal derived for the first load, and with the second input which is coupled to the switch means through the discharge path to receive a signal generated by the discharge of the capacitor, the summing integrator means being operable to generate a voltage at its output that is proportional to a unit of energy being consumed by the two loads; and unit measuring means coupled to the output of the summing integrator means and responsive to an output signal therefrom for generating a signal representing the consumption of a preselected unit of energy by the two loads.

7. The summing circuit of claim 6, wherein the first means for generating the control signal includes:

triggering pulse means with an input at which the energy demand pulse is recorded, the triggering pulse means being responsive to the energy demand pulse for generating a resultant output pulse; and one-shot pulse means coupled between the triggering pulse means and the switch means and responsive to the output pulse from the triggering pulse means to generate the control signal.

8. The summing circuit of claim 6, wherein the unit measuring means includes:

voltage level detection means coupled to the output of the summing integrator means for generating an output signal when the output of the summing integrator means reaches a preselected value; and reset means, coupled back to the summing integrator means, and coupled to the voltage level detection means and responsive to an output signal therefrom, for generating a signal that terminates integration to define a unit of energy consumption.

9. The summing circuit of claim 8, wherein the unit measuring means further includes:

a dual-coil latching relay in which switch contacts are operated;

flip-flop means having a first output connected to a first coil on the latching relay and having a second output connected to a second coil on the latching relay; and one-shot pulse means coupling the output of the voltage level detection means to the flip-flop means and responsive to an output signal from the voltage level detection means to cause the energizing of one of the coils in the latching relay and the operation of the switch contacts therein.

10. The summing circuit of claim 8, wherein the reset means includes a one-shot multivibrator coupled between the output of the voltage level detection means and the summing integrator means.

* * * * *